United States Patent
Singh et al.

(10) Patent No.: US 7,262,138 B1
(45) Date of Patent: Aug. 28, 2007

(54) ORGANIC BARC WITH ADJUSTABLE ETCH RATE

(75) Inventors: Bhanwar Singh, Morgan Hill, CA (US); Ramkumar Subramanian, Sunnyvale, CA (US); Gilles Amblard, San Jose, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 451 days.

(21) Appl. No.: 10/957,111

(22) Filed: Oct. 1, 2004

(51) Int. Cl.
*H01L 21/302* (2006.01)

(52) U.S. Cl. .................. 438/714; 438/715; 438/717; 438/725; 438/736

(58) Field of Classification Search ............... 438/715, 438/717, 725, 736
See application file for complete search history.

(56) References Cited

U.S. PATENT DOCUMENTS

| | | | |
|---|---|---|---|
| 5,593,725 A * | 1/1997 | Park et al. ............... | 427/160 |
| 6,699,641 B1 * | 3/2004 | Hellig et al. ............. | 430/312 |
| 6,787,452 B2 * | 9/2004 | Sudijono et al. .......... | 438/637 |
| 2003/0198898 A1 * | 10/2003 | Lin et al. ............... | 430/315 |
| 2004/0018451 A1 * | 1/2004 | Choi .................... | 430/313 |
| 2004/0048194 A1 * | 3/2004 | Breyta et al. ............ | 430/271.1 |
| 2004/0265713 A1 * | 12/2004 | Shiobara et al. ........ | 430/30 |
| 2005/0064322 A1 * | 3/2005 | Babich et al. .......... | 430/270.1 |
| 2005/0167514 A1 * | 8/2005 | Kaushal et al. ......... | 236/1 C |

\* cited by examiner

*Primary Examiner*—Nadine Norton
*Assistant Examiner*—Binh X. Tran
(74) *Attorney, Agent, or Firm*—Amin, Turocy & Calvin, LLP

(57) ABSTRACT

Systems and method for adjusting an etch rate of an organic bottom antireflective coating (BARC) layer on a wafer. The BARC layer can be exposed to an energy source at varied intensities to determine a relationship between bake temperature and solubility of the BARC after baking, which correlates to a rate at which the BARC can be etched. The BARC can be a cross-linking BARC, which becomes more cross-linked as bake temperature is increased, resulting in decreased etch rate, or can be a cleaving BARC, which is subject to removal of etch-resistant monomers as bake temperature is increased, resulting in increased etch rate. Thus, the invention provides for adjustable BARC etch rates that can be aligned to an etch rate of a photoresist deposited over the BARC to permit concurrent etching of both layers while mitigating structural defects that can occur if etch rates of the respective layers differ.

13 Claims, 14 Drawing Sheets

FIG. 10
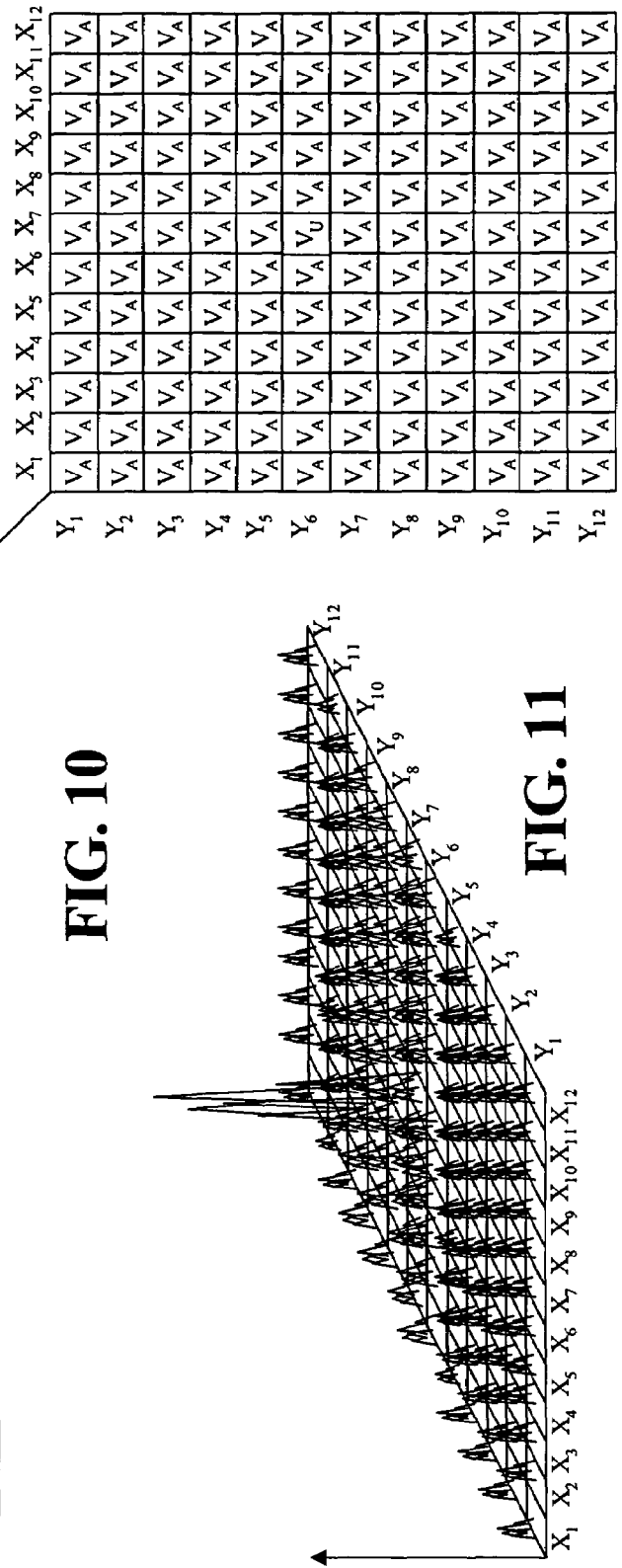
FIG. 12
FIG. 11

ORGANIC BARC WITH ADJUSTABLE ETCH RATE

TECHNICAL FIELD

The present invention relates generally to semiconductor fabrication, and more particularly to systems and methodologies to facilitate control and adjustment of etch rate(s) of organic bottom anti-reflective coatings (BARCs).

BACKGROUND OF THE INVENTION

In the semiconductor industry, there is a continuing trend toward higher device densities. To achieve these high device densities there have been, and continue to be, efforts toward scaling down device dimensions (e.g., at sub-micron levels) on semiconductor wafers. In order to accomplish such densities, smaller feature sizes and more precise feature shapes are required. This may include width and spacing of interconnecting lines, spacing and diameter of contact holes, and surface geometry, such as corners and edges, of various features. The dimensions of and between such small features can be referred to as critical dimensions (CDs). Reducing CDs and reproducing more accurate CDs facilitates achieving higher device densities.

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to a transfer of patterns onto a thin film that has been deposited onto a substrate. The transferred patterns then act as a blueprint for desired circuit components. Typically, various patterns are transferred to a photoresist (e.g., radiation-sensitive film), which overlies the thin film on the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permits a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Techniques, equipment and monitoring systems have concentrated on preventing and/or decreasing defect occurrence within lithography processes. For example, aspects of resist processes that are typically monitored can comprise: whether the correct mask has been used; whether resist film qualities are acceptable (e.g., whether resist is free from contamination, scratches, bubbles, striations, . . . ); whether image quality is adequate (e.g., good edge definition, line-width uniformity, and/or indications of bridging); whether defect types and densities are recorded; and/or whether registration is within specified limits; etc.

Anti-reflective coatings (ARCs) are known and used to mitigate the aforementioned problems by attenuating or absorbing the light waves reflected from the substrate surface during photo exposure operations to improve image contrast. An ARC is typically interposed between the substrate surface and the photoresist so as to serve as a barrier that inhibits the reflected waves from traversing back through the photoresist and adversely affecting the imaging process, which helps in defining images. Dielectric anti-reflective coating (DARC) and bottom anti-reflective coating (BARC) are examples of anti-reflective materials that are commonly used to absorb radiation reflected from the substrate surface during the photo imaging operations of integrated circuit processing. The BARC cuts down on light scattering into the resist, and is generally available as a low-viscosity liquid, such as inorganic $SiN_x$, that can be applied onto the substrate surface using a well-known spin coating process.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that facilitate control of the etch rate of organic BARCs on a semiconductor wafer. The etch rate of an organic BARC can be adjusted via manipulation of bake temperature during a bake of the wafer. In this manner, an etch rate of an organic BARC can be aligned and/or matched to that of the resist on a wafer.

An aspect of the invention provides for employing a monitoring component, such as, for example, a scatterometry component, to provide real-time information regarding temperature, solubility, etc., parameters associated with a wafer. A control component can process information associated with variations in temperature and/or solubility and can selectively adjust temperature during a bake period in order adjust an etch rate of an organic BARC underlying a photoresist. For example, solubility of an organic BARC can be sampled after baking at varied temperatures in order to provide information regarding change in solubility with respect to bake temperature, which facilitates deducing an etch rate of a BARC that was baked at a given temperature. Such information can then be employed to vary the solubility of a given organic BARC material to more closely align an etch rate of the BARC to an etch rate of a photoresist overlying the organic BARC.

According to another aspect of the invention, feedback/feed-forward data can be generated and loops can be created to facilitate efficient communication between a monitoring component and an temperature control component. Such feedback can be employed to adjust temperature parameters within regions of a single wafer, from one wafer to the next, etc. For example, a BARC that exhibits increased cross-linking between molecules (e.g., decreased solubility) as bake temperature is increased will have a lower etch rate after baking at higher temperatures. Alternatively, a different type of BARC can exhibit increased solubility when bake temperature is increased, such that molecules providing cross-link structure to the BARC can be cleaved at higher temperatures to increase etch rate. In either case, the BARC etch rate can be experimentally determined to permit etch-rate adjustment via temperature manipulation during a bake period.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 10 illustrates a perspective view of a grid-mapped wafer according to one or more aspects of the present invention.

FIG. 11 illustrates plots of measurements taken at grid-mapped locations on a wafer in accordance with one or more aspects of the present invention.

FIG. 12 illustrates a table containing entries corresponding to measurements taken at respective grid-mapped locations on a wafer in accordance with one or more aspects of the present invention.

DETAILED DESCRIPTION OF THE INVENTION

Figure 1:
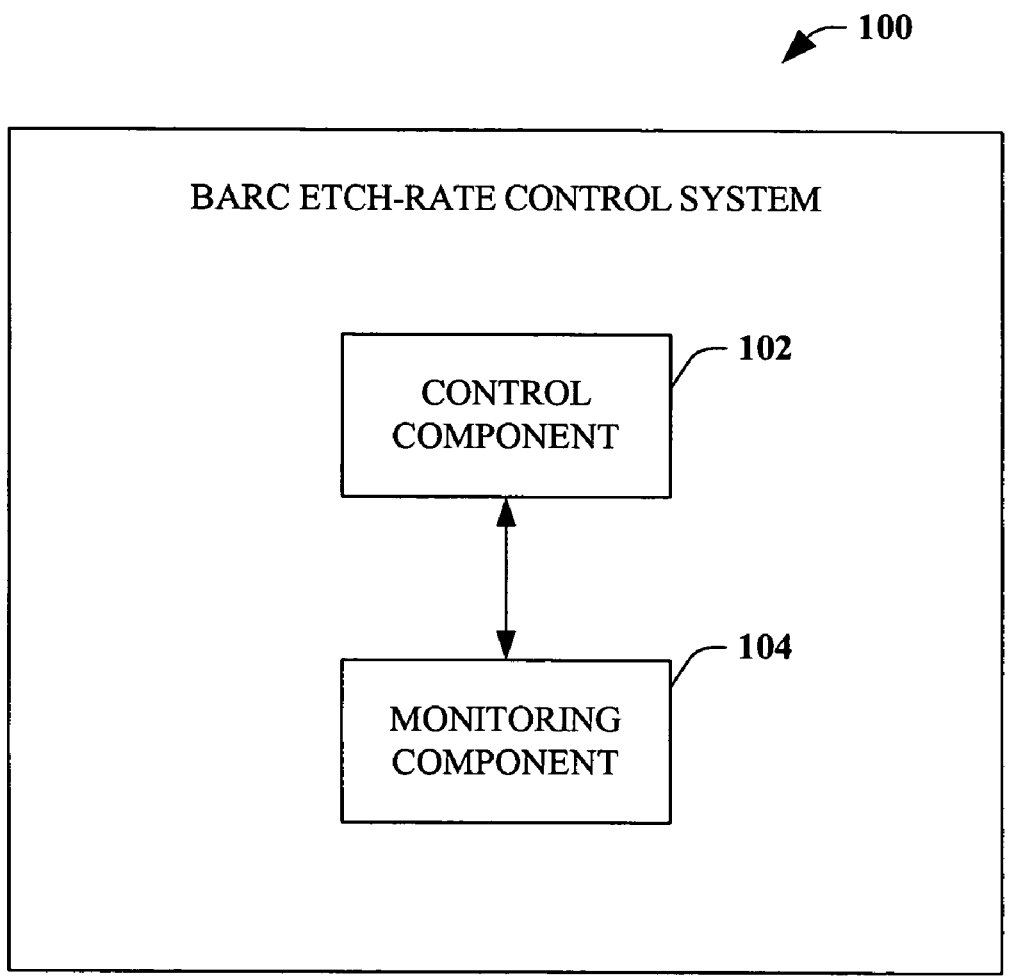
FIG. 1 is an illustration of a system that facilitates adjusting organic BARC etch-rate in a wafer manufacturing environment in accordance with an aspect of the present invention.

The present invention will now be described with reference to the drawings, wherein like reference numerals are used to refer to like elements throughout. The present invention will be described with reference to systems and methods for providing a simple control approach that can account for DICD variation in order to maintain control of BARC etch-rate in a tapered contact hole. It should be understood that the description of these exemplary aspects are merely illustrative and that they should not be taken in a limiting sense.

The term "component" can refer to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

FIG. 1 is an illustration of a BARC etch-rate control system 100 according to an aspect of the present invention, in which a control component 102 is operatively coupled to a monitoring component 104. The control component 102 can receive information from the monitoring component 104 regarding real-time status of layers on a semiconductor wafer, such as, for example, solubility of a photoresist layer and/or a BARC layer, etch-rate and/or temperature thereof, etc. The control component 102 can analyze such information to selectively adjust parameters associated with a wafer manufacturing environment during a bake process in order to fine-tune an etch rate for a BARC layer. For example, the monitoring component 104 can glean information regarding BARC solubility after a bake period at a given temperature, and the control component 102 can alter the temperature therein according to a desired increase or decrease of BARC solubility in order to experimentally determine a correlation between solubility of a BARC after a bake period and the temperature at which the BARC was baked. This in turn can permit adjustment of BARC etch rate during an etching period via manipulation of bake temperature during a bake period that precedes the etching period.

As used herein, a "cross-linking" BARC describes a BARC comprising material that becomes more cross-linked as temperature is increased. Cross-links occur between molecules of the BARC material and decrease solubility such that the etch rate of a cross-linking BARC is reduced as bake temperature is increased (e.g., due to increased cross-linkage). Additionally, different cross-linking reactions can occur at different temperature plateaus, such that etch rate can be selectively controlled in a plurality of regions on a temperature scale. For example, if a cross-linking BARC layer exhibits a solubility of S after baking at a temperature T, a first cross-linking reaction that decreases BARC solubility by 10% can occur during a bake at a temperature $T+C_1$, where $C_1$ is a constant value. Thus, after baking at temperature $T+C_1$, the BARC will exhibit a solubility of 0.9 S, and the etch rate of the BARC will be reduced accordingly. A second cross-linking reaction can occur at a bake temperature $T+C_2$, where $C_2$ is a constant value, whereby the solubility of the BARC is reduced by a further 10%, such that after a bake at temperature $T+C_2$ the solubility of the BARC will be 0.81 S., etc. Thus, if a photoresist overlying a BARC has a solubility of 0.81 S, the temperature at which a wafer is baked can be raised to $T+C_2$ to facilitate tuning the etch rate of the BARC to the etch rate of the photoresist (e.g., to facilitate concurrent, even etching of both layers.) Alternatively, it can be desirable to etch the BARC at a different rate than the photoresist. In such a scenario, if a photoresist has a solubility of S, temperature can be increased in the manner described above to create a disparity in the rates at which photoresist and BARC layers are etched. The preceding example(s) are illustrative in nature and is not intended to limit the number of temperature levels at which a cross-linking reaction can occur to reduce solubility and/or etch rate of a BARC layer, the magnitude of the decrease in solubility of the BARC layer at a given bake temperature, etc.

A "cleaving" BARC describes a BARC comprising material that becomes less cross-linked as bake temperature is increased, thereby becoming more soluble and having a higher etch rate. For example, as bake temperature is increased, etch-resistant functional groups on polymer chains can be cleaved from the polymer chain, which can compromise the integrity of the polymer structure to make the polymer more soluble. For instance, if a cleaving BARC layer exhibits a solubility of S after baking at a temperature T, a first cleaving reaction that increases BARC solubility by 10% can occur during a bake at a temperature $T+C_1$, where $C_1$ is a constant value. Thus, after a bake at temperature $T+C_1$, the cleaving BARC will exhibit a solubility of 1.1 S, and the etch rate of the BARC will be increased accordingly. A second cleaving reaction can occur at a bake temperature $T+C_2$, where $C_2$ is a constant value, whereby the solubility of the BARC is increased by a further 10%, such that after baking at temperature $T+C_2$ the solubility of the BARC will be 1.21 S., etc. Thus, if a photoresist overlying a BARC has a solubility of 1.21 S, the temperature at which a wafer is baked can be raised to $T+C_2$ to facilitate tuning the etch rate of the BARC to the etch rate of the photoresist (e.g., to facilitate concurrent, even etching of both layers.) Alternatively, it can be desirable to etch the BARC at a different rate than the photoresist. In such a case, if a photoresist has a solubility of S, bake temperature can be increased in the manner described above to create a disparity in the rates at which photoresist and BARC layers are etched. The preceding example is illustrative in nature and is not intended to limit the number of bake temperature levels at which a cleaving reaction can occur to increase solubility and/or etch rate of a BARC layer, the magnitude of the increase in solubility of the BARC layer after baking at a given temperature, etc.

Etch rates of a BARC, whether cross-linking or cleaving, can be experimentally determined prior to wafer fabrication. For example, the monitoring component 104 can take solubility measurements of a given BARC layer after baking at various temperatures in order to facilitate subsequent determinations of an optimal bake temperature to be employed to achieve a desired etch rate for a BARC layer. The desired etch rate can be based at least in part, for example, on a known etch rate, solubility, etc., of a photoresist that is to be deposited over the BARC, in order to facilitate alignment of the BARC etch rate with that of the photoresist. According to another example, energy (e.g., ultraviolet light, deep UV, . . . ) can be directed onto various regions of a single wafer. Energy bands of different intensities can cause varied temperatures on a wafer, in order to permit stages of etch-resistance on a single wafer. For instance, bands of energy can be emitted at a width of, for example, 10 mm, in order to created regions of varied solubility that are 10 mm wide. In this manner, temperatures can be varied on a single wafer and etch rates can be deduced via analysis of post-exposure solubility data.

It is to be appreciated that the monitoring component 104 can be, for example, a scatterometry component. The present invention contemplates any suitable scatterometry component and/or system, and such systems are intended to fall within the scope of the hereto-appended claims. It is further to be appreciated that the monitoring component 104 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitoring component 104 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

It is further to be appreciated that information gathered by the monitoring component 104 can be utilized for generating feedback and/or feed-forward data that can facilitate achieving a desired etch rate for a BARC underlying a photoresist and/or aligning the etch rate of the BARC to the etch rate of the photoresist, etc. The BARC etch-rate control system 100 can additionally employ such data to control components and/or operating parameters associated therewith. For instance, feedback/feed-forward information can be generated from sequence analysis to maintain, increase and/or decrease a rate at which fabrication processes (e.g., etching, baking, . . . ) progress. Additionally, one or a plurality of sensors can be associated with the BARC etch-rate control system 100 to permit data to be gathered regarding the state of the wafer (e.g., temperature, density, viscosity, material composition, and/or any other suitable information related to the condition of the wafer and/or layers thereon).

Figure 2:
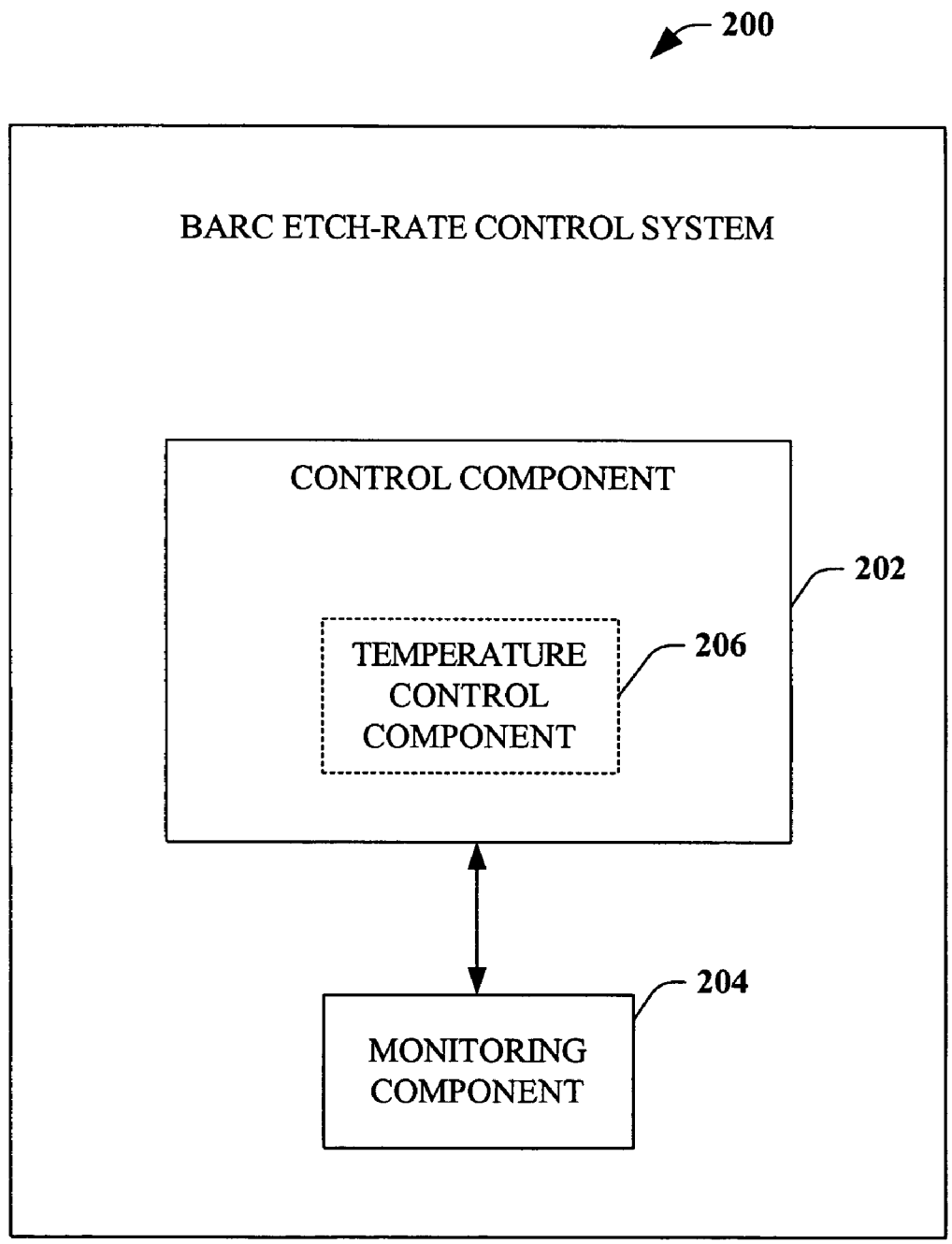
FIG. 2 is an illustration of a system that facilitates aligning BARC etch-rate with a photoresist etch rate in accordance with an aspect of the present invention.

FIG. 2 is an illustration of a BARC etch-rate control system 200 in accordance with an aspect of the invention that comprises a control component 202 that is operatively coupled to a monitoring component 204. The control component 202 comprises a temperature control component 206 that can adjust temperature in a wafer manufacture environment during, for example, a bake period of a wafer. According to this aspect of the invention, BARC material can be baked at different temperatures, and the solubility of the BARC material after baking at each respective temperature can be measured by the monitoring component 204. In this manner, temperature can be experimentally adjusted to predetermine correlations between the temperature at which a particular BARC is baked and the solubility of the BARC after baking at that temperature. Solubility of the BARC dictates the rate at which the BARC can be etched. Temperature and solubility information can then be employed by the control component 202 to determine a desirable temperature at which to bake a wafer having a BARC layer underlying a photoresist layer in order to match the etch rate of the BARC layer to that of the photoresist layer, which in turn facilitates smoother etching and defect mitigation.

Figure 3:
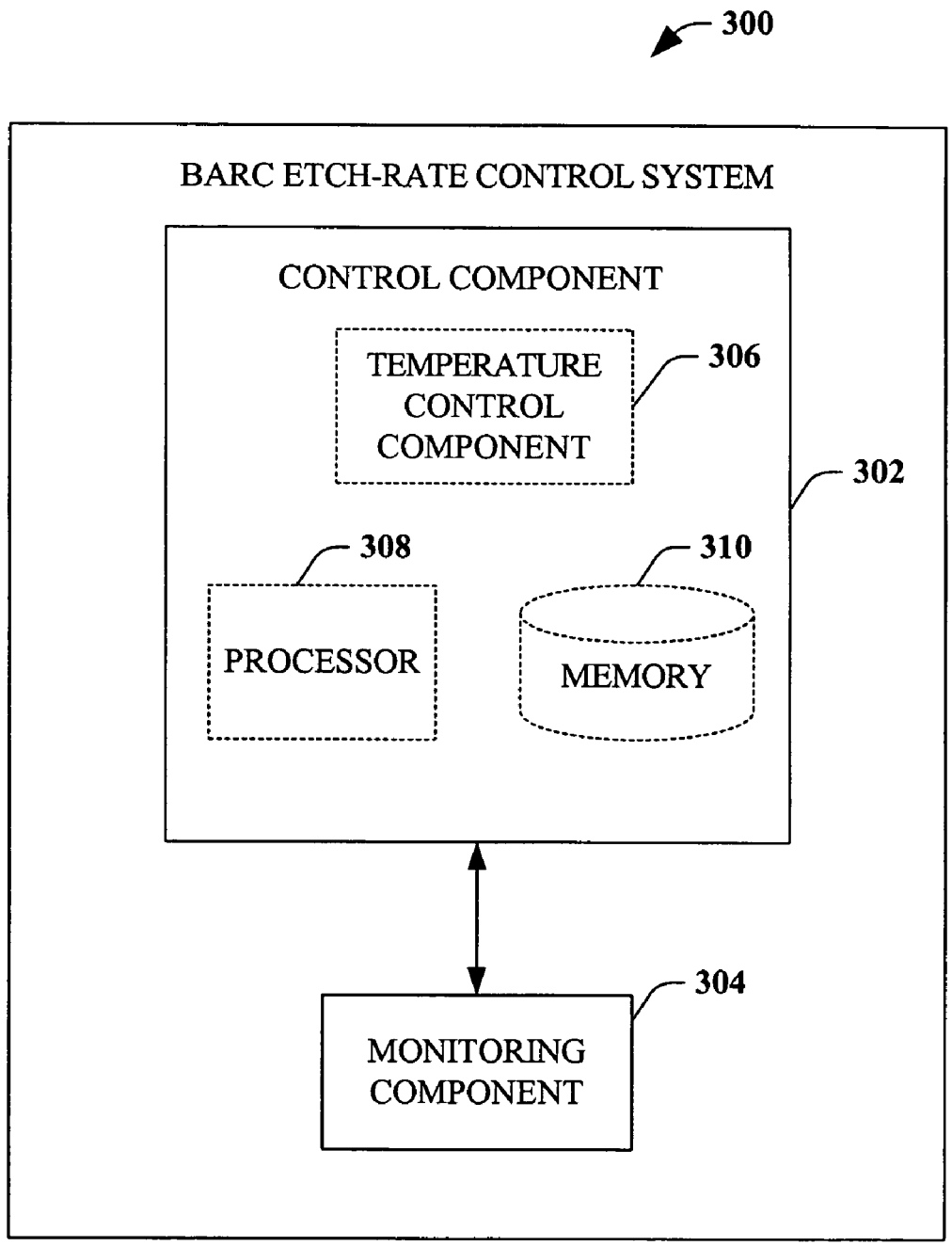
FIG. 3 is an illustration of a system that facilitates controlling BARC etch-rate via varying bake temperature of the BARC before concurrent etching of the BARC and a photoresist deposited there over, in accordance with an aspect of the present invention.

FIG. 3 is an illustration of a BARC etch-rate control system 300 in accordance with an aspect of the invention that comprises a processor 306 and a memory 308. According to the figure, a control component 302 is operably coupled to a monitoring component 304. The control component 302 comprises a temperature control component 306 that can vary bake temperatures in order to facilitate determinations of solubility variations corresponding to various bake temperatures, which data in turn can be measured by the monitoring component 304 and received by the control component 302 for analysis. The control component is further associated with a processor 308 and a memory 310, each of which is further operably coupled to the other.

It is to be understood that a that the processor 308 can be a processor dedicated to analyzing temperature/solubility information and/or facilitating BARC etch-rate control, a processor used to control one or more of the components of the BARC etch-rate control system, or, alternatively, a processor that is both used analyze temperature/solubility information and/or facilitating BARC etch-rate control and to control one or more of the components of the BARC etch-rate control system, without being limited thereto.

The memory component 310 can be employed to retain information associated with, for example, bake temperature and/or solubility variation, the degree etch rate variation, etc. Furthermore, the memory 310 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 310 of the present systems and methods is intended to comprise, without being limited to, these and any other suitable types of memory.

Figure 4:
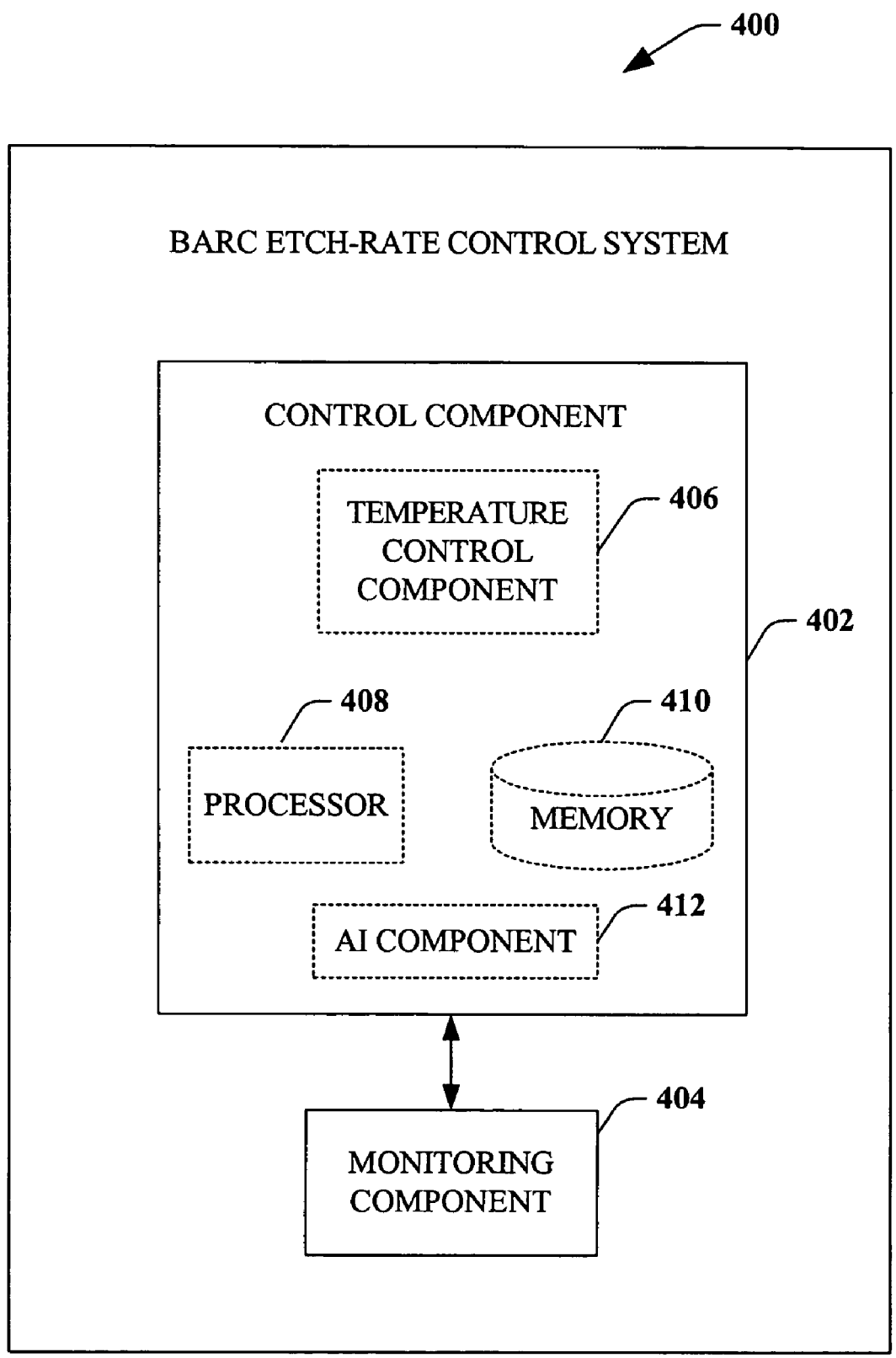
FIG. 4 is an illustration of a system that facilitates controlling BARC etch-rate comprising an artificial intelligence component that makes inferences regarding the etch rate of an organic BARC, in accordance with an aspect of the present invention.

FIG. 4 is an illustration of a system 400 in accordance with an aspect of the present invention. The system 400 can employ various inference schemes and/or techniques in connection with controlling BARC etch rate. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 4, a control component 402 is operatively coupled to a monitoring component 404. The monitoring component 404 can detect variations in solubility of a BARC layer on a wafer after baking of the wafer. The control component comprises a temperature control component 406 that can vary bake temperatures in order to vary solubility of a BARC layer on a wafer. Solubility of the BARC layer can be measured by the monitoring component 404 to ensure that the BARC layer will permit a desired etch rate. Associated with the control component 402 are a processor 408, a memory 410, and an AI component 412 that can make inferences regarding whether and to what extent the system 400 should vary bake temperature to achieve a desired BARC etch rate. For example, if baking a wafer with a BARC layer thereon at a standard bake temperature causes a the BARC to exhibit a solubility that differs from that of a photoresist to be deposited over the BARC layer, the AI component 412 can make inferences regarding whether and to what extent to adjust the bake temperature to facilitate altering the solubility of the BARC, which in turn can permit alignment of BARC etch rate with photoresist etch rate. For instance, if it is determined that the solubility of a photoresist is greater than that of a cleaving BARC, then the AI component 412 can infer an appropriate bake temperature increase to facilitate cleaving reactions (e.g., removal of etch-resistant functional groups) within the cleaving BARC polymer chains to increase the solubility thereof. In this manner, the etch rate of the cleaving BARC can be increased to match the etch rate of a photoresist deposited over the cleaving BARC, if desired. Similarly, if it is determined that a photoresist material is less soluble than, for example, a cross-linking BARC layer on a wafer, then the AI component 412 can infer an appropriate bake temperature increase to facilitate increasing cross-linkage within the cross-linking BARC to decrease the solubility thereof. In this manner, the etch rate of the cross-linking BARC can be decreased to match the etch rate of the photoresist deposited over the cross-linking BARC, if desired. It is to be appreciated that the above examples are illustrative in nature, and are not intended to limit the potential number of inferences that can be made by the AI component 412 or the manner in which such inferences are made.

Figure 5:
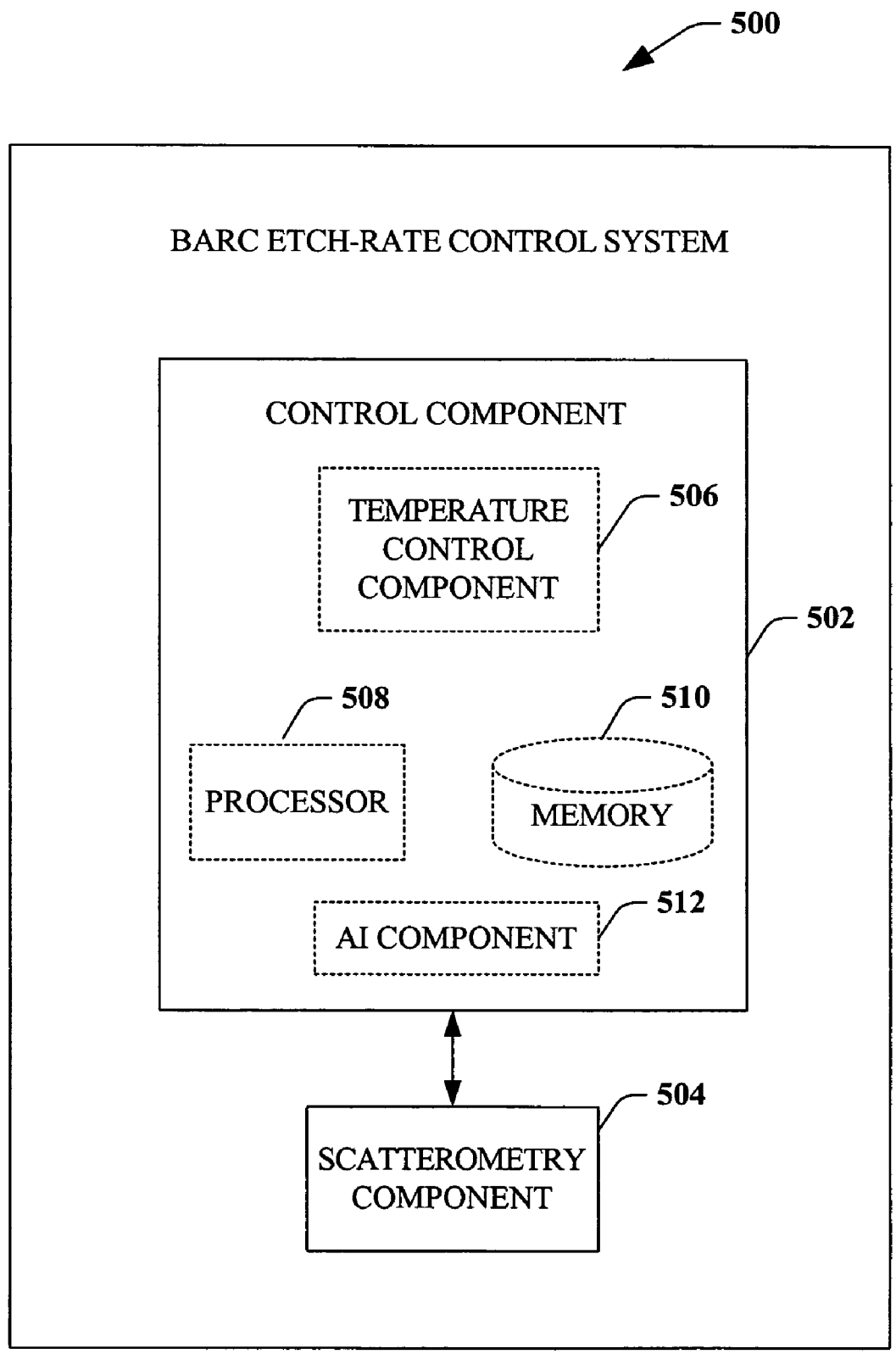
FIG. 5 is an illustration of a system that facilitates controlling BARC etch-rate comprising a scatterometry component provides information related to solubility and/or etch rate of an organic BARC, in accordance with an aspect of the present invention.

FIG. 5 is an illustration of a BARC etch-rate control system 500 in accordance with an aspect of the invention in which the monitoring component described with respect to FIGS. 1-4 is a scatterometry component. A control component 502 is operably coupled to a scatterometry component 504 that can monitor various aspects of a wafer in a manufacturing environment, such as solubility, density, contour, etc. The control component 502 is operatively associated with a temperature control component 506, a processor 508, and memory 510, and an AI component 512. The scatterometry component is particularly well-adapted to monitor a wafer in conjunction with various aspects of the present invention.

Scatterometry is a technique for extracting information about a surface upon which incident light has been directed. Information concerning properties including, but not limited to, dishing, erosion, profile, chemical composition, thickness of thin films and critical dimensions of features present on a surface, such as a wafer, can be extracted. Furthermore, information about an immersion medium such as refractive index and lithographic constant can be extracted by utilizing scatterometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number, type of layers beneath the surface, refractive index of the surface, etc.

Different combinations of the above-mentioned properties can have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the immersion medium utilized in connection with a known grating structure on the surface. Such substantially unique phase/intensity signatures are produced by light reflected from and/or refracted by different surfaces and/or immersion mediums due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is the square root of (−1).

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer or of an immersion medium can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals, to determine whether the signals correspond to a stored signature. The present invention contemplates any suitable scatterometry component and/or system, and such systems are intended to fall within the scope of the hereto-appended claims.

Figure 6:
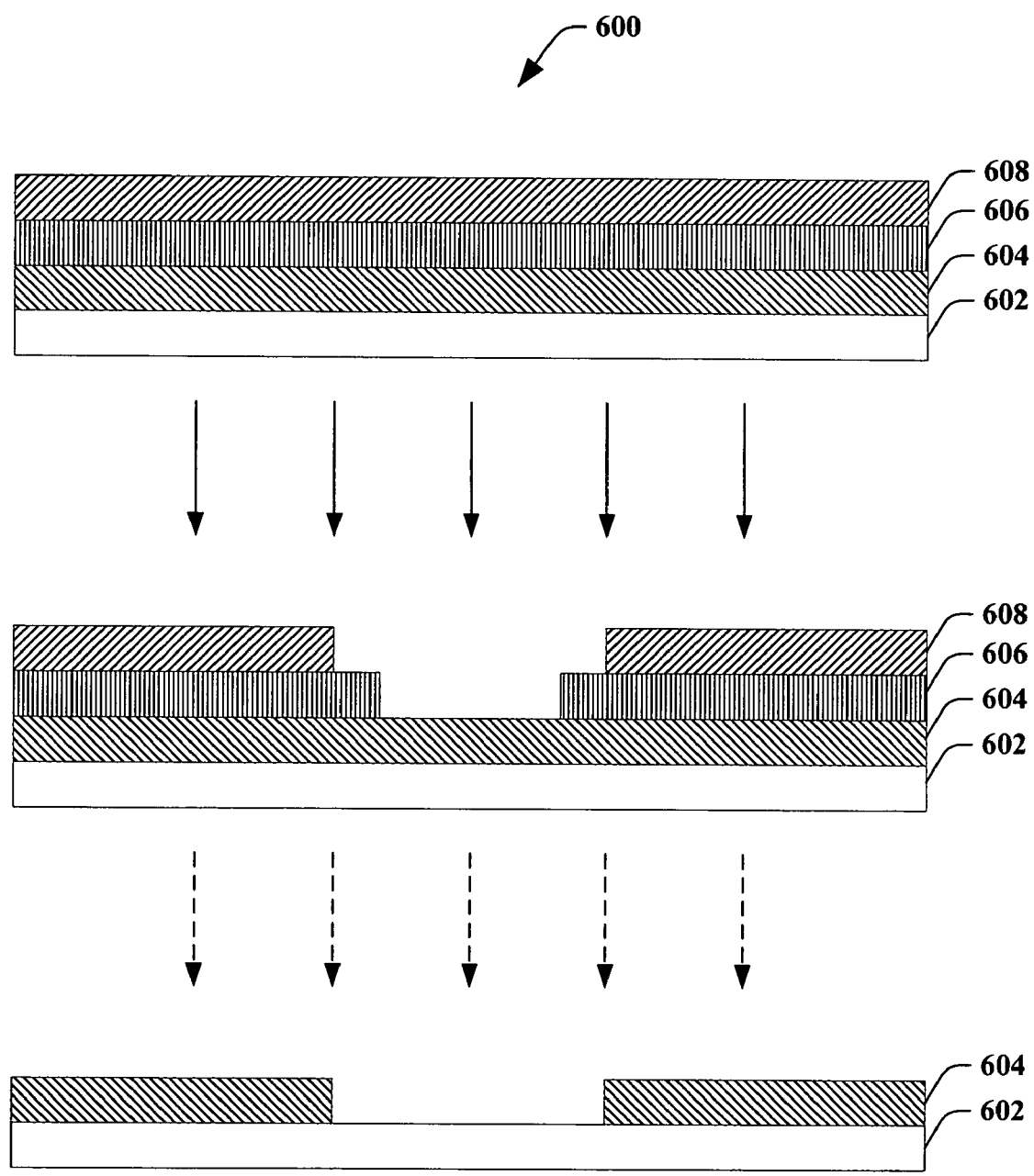
FIG. 6 is an illustration of a wafer during an etch process in which etch rates of an organic BARC and an overlying photoresist are not aligned.

FIG. 6 is a cross-sectional illustration of a wafer 600 comprising several layers which can include a BARC layer and a photoresist layer, in accordance with an aspect of the present invention. There is provided a substrate layer 602 that can comprise any number of sublayers, for example, an insulating layer 604 of an ILD (inter-level dielectric) between wiring layers. Such ILD (and layer) materials are well known in the art, and include silicon oxide ($SiO_x$) and silicon nitride ($SiON_x$), and various combinations thereof. The substrate layer 602 can also comprise aluminum, polysilicon, or SILOX, for example.

An organic BARC layer 606 is formed over the substrate layer 602 and/or insulating layer(s) 604 to minimize reflections during lithography processes. The BARC layer 606 can be made from, for example, conventional spin-on organic materials such as polyimides, polysulfones, and the like. The BARC can be KrF16b from AZ-CLARIANT, or AR7, for example. Other examples of suitable organic BARCs can comprise organic BARCs manufactured by, for instance, Brewer Science, Clariant, Shipley, Hitachi, Tokyo Ohka, etc. A photoresist layer 608 can be formed over the BARC layer 606. Processes for forming the BARC layer 606 and photoresist layer 608 are well known in the art, and typically can comprise spin-on and CVD (Chemical Vapor Deposition) techniques. The BARC solution can be spun uniformly over the wafer surface at a particular point in semiconductor process, and typically at a thickness ranging from about 25 nm to about 150 nm.

Photolithography is a process whereby an image is formed in the resist film layer 608 during development by exploiting the difference in dissolution rates of the exposed and unexposed regions. Pattern formation, using a chemically amplified photoresist with photoacid generators, begins with the generation of an acid catalyst during exposure to light (or other forms of radiation). The photoacid generator can be suitable for a variety of irradiation sources, including, for example, mercury g-line (436 nm), h-line (405 nm), i-line (365 nm), KrF laser (248 nm), and ArF laser (193 nm).

An etch process is illustrated by vertical arrows. If the BARC layer 606 has a lower solubility than the photoresist layer 608, then the BARC layer 606 will not succumb to an etching process as quickly as the photoresist layer 608 will, as is illustrated in FIG. 6. When a stripping procedure (illustrated by inverted, hashed arrows) is performed to remove remnant photoresist and/or organic BARC material, the remaining patterned wafer can exhibit undesirable critical dimension(s) with regard to structures and/or patterns thereon. In this particular example, if a cleaving BARC were employed, the temperature during baking can be adjusted to facilitate aligning the etch rate of the BARC 606 with the etch rate of the photoresist 608, as is shown in FIG. 7.

Figure 7:
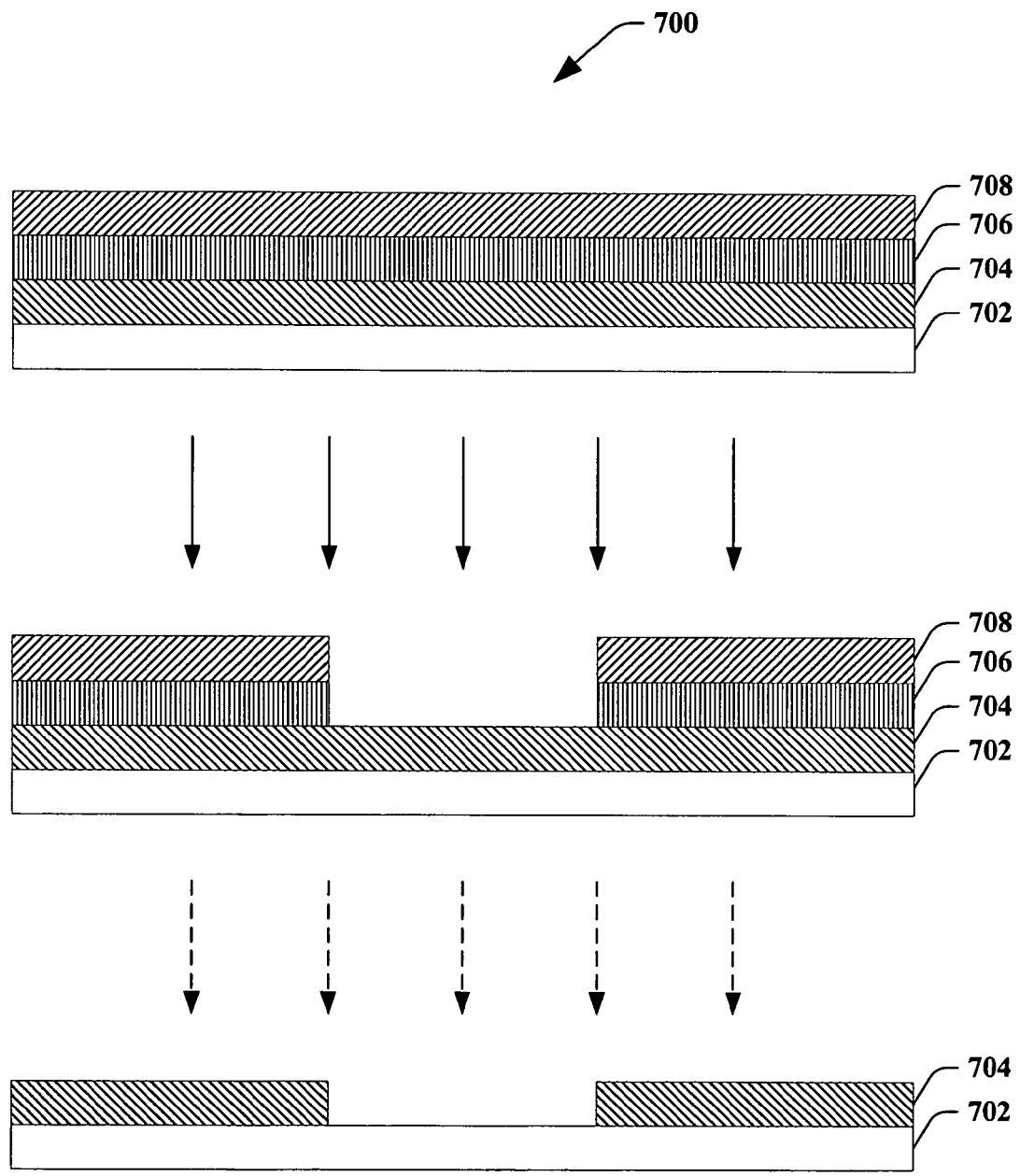
FIG. 7 is an illustration of a wafer during an etch process in which etch rates of an organic BARC and an overlying photoresist have been aligned via manipulation of bake temperature during baking of the BARC.

FIG. 7 illustrates a cross-section of a wafer 700 comprising a substrate 702, one or more dielectric layers 704, an organic BARC layer 706, and a photoresist layer 708. If it is determined and/or known that the photoresist has a higher solubility than, for example a cleaving BARC layer 706, then bake temperature can be increased to encourage a cleaving reaction wherein a cleaving monomers can be removed from the BARC polymer chains to increase solubility of the BARC layer 706 and adjust the etch rate thereof to more closely align with an etch rate of the photoresist. When an etch is performed (illustrated by inverted arrows), the BARC layer can then be etched smoothly and consistently with respect to the photoresist, which can facilitate mitigation of line-edge roughness and/or other defects than can result from an etch performed on a BARC layer and photoresist layer having disparate etch rates. Then, upon performing a stripping procedure (illustrated by inverted, hashed arrows) to remove remnant photoresist and/or organic BARC material, the remaining patterned wafer will exhibit structures and/or patterns within target critical dimensions.

According to another example, the solubility of a photoresist 708 can be known and/or determined to be less than that of a particular cross-linking BARC, which can result in undercutting defects that in turn can detrimentally affect wafer critical dimension(s), and ultimately performance of the finished product. To mitigate such occurrences, bake temperature can be increased to encourage greater cross-linkage in the BARC layer 706 to reduce the solubility thereof in order to align the etch rate of the BARC layer 706 with that of the photoresist 708. In this manner, when a stripping procedure (illustrated by inverted, hashed arrows) is performed to remove remnant photoresist and/or organic BARC material, the remaining patterned wafer will exhibit structures and/or patterns within target critical dimensions.

Figure 8:
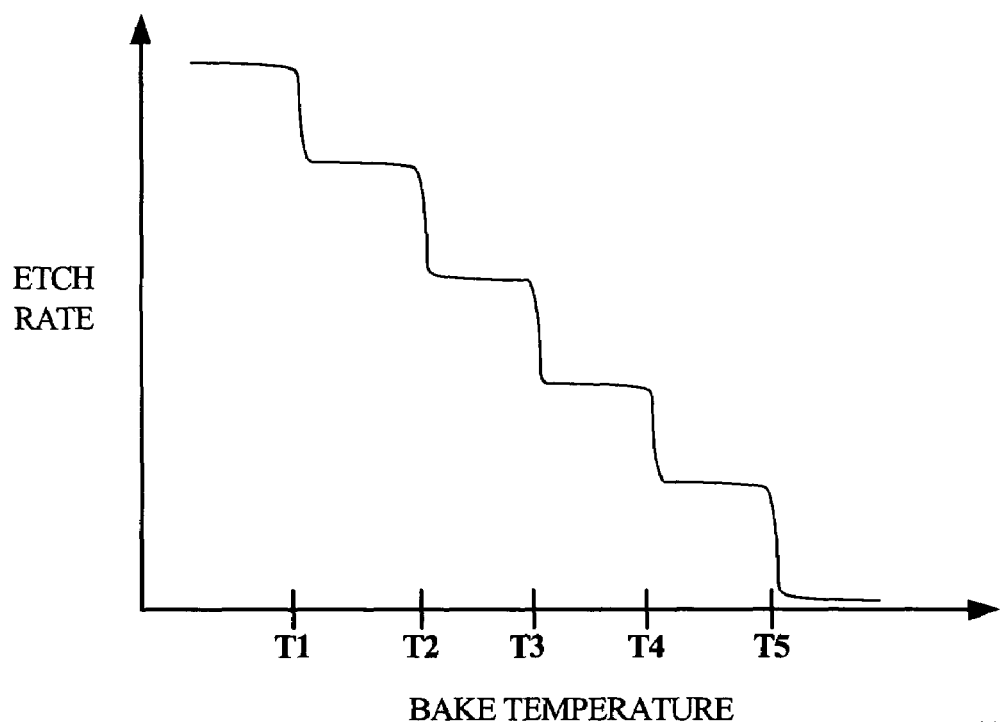
FIG. 8 represents a relationship between bake temperature employed for a cross-linking BARC, wherein, as temperature is increased, etch rate is decreased.
Figure 9:
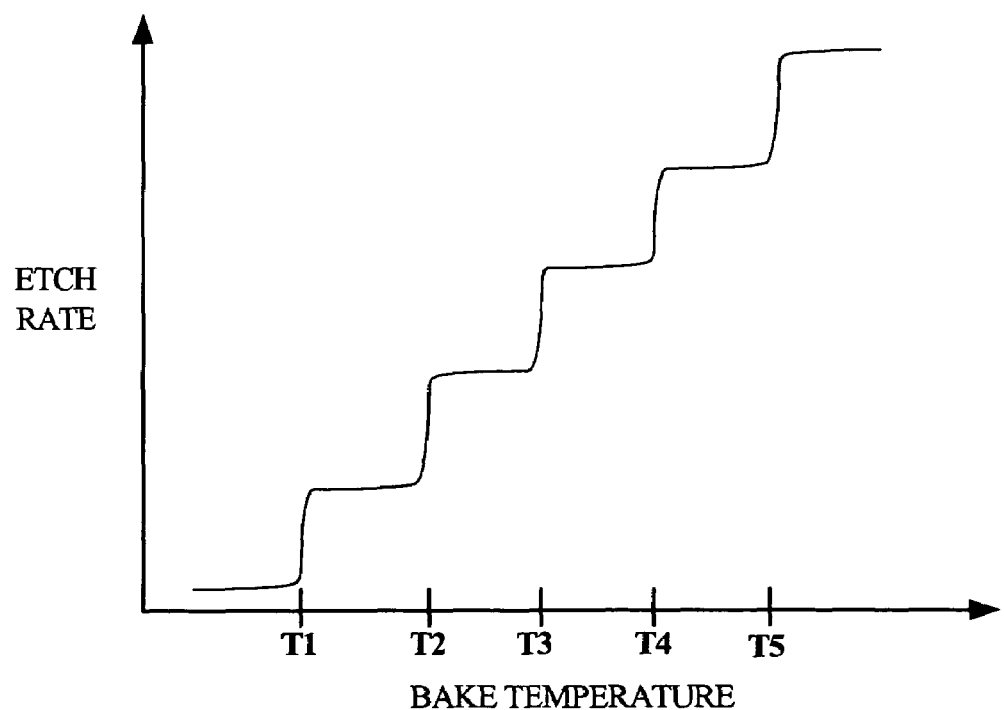
FIG. 9 illustrates a correlation between bake temperature of a cleaving BARC and etch rate of the cleaving BARC.

FIGS. 8 and 9 illustrate exemplary plots of bake temperature and etch rate correlations in accordance with aspects of the present invention. FIG. 8 represents a relationship between bake temperature employed for a cross-linking BARC, wherein, as temperature is increased, etch rate is decreased. As illustrated, etch rate (and solubility) decreases sharply in response to certain crucial temperature points, and remains relatively constant at bake temperature intervals between crucial points. This is so because increasing bake temperature of the cross-linking BARC to a first crucial temperature causes the cross-linking BARC material to become more cross-linked (e.g., strengthening the structure of the BARC layer and decreasing solubility thereof). Additional cross-linking between molecules in the cross-linking BARC layer can occur at each successive crucial bake temperature, causing further reduction of BARC solubility and, accordingly, further reduction of etch rate associated therewith. In this manner, etch rate of the cross-linking BARC can be reduced to a preferred rate, and, if desired, to match an etch rate of a photoresist layer deposited over the BARC layer on a wafer. It is to be appreciated that the critical temperatures at which cross-linkage is augmented to increase etch rate need not be evenly incremented as illustrated in FIG. 9, but rather can occur at any suitable temperature position on the scale. For example, critical temperatures (and corresponding etch rates) can exhibit a pseudo-Gaussian distribution if desired, depending on the particular critical temperatures at which cross-linking reactions occur.

FIG. 9 illustrates a correlation between bake temperature of a cleaving BARC and etch rate of the cleaving BARC. As temperature is increased, crucial temperature points are reached at which cleaving reactions can occur that effectively cleave etch-resistant monomers from polymer chains in a cleaving BARC layer. For example, monomer A can experience a cleaving reaction at a temperature T1, causing a marked increase in the solubility of the cleaving BARC, and, consequently, an increase in the rate at which the cleaving BARC can be etched. A second etch-resistant monomer, monomer B, is unaffected by the bake temperature increase to T1. However, monomer B can be affected if the bake temperature is increased to T2, at which temperature monomer B can be cleaved from the cleaving BARC polymer chains in order to further increase solubility, and thereby increase etch rate of the cleaving BARC. In this manner, the solubility of the cleaving BARC can be selectively increased to facilitate faster etching of the cleaving BARC, and, if desired, alignment of cleaving BARC etch rate to an etch rate of a photoresist layer deposited over the cleaving BARC layer. It is to be appreciated that the cleaving BARC material described herein is not limited to two cleaving monomers, but rather can comprise any suitable number of cleaving monomers in order to facilitate fine-tuning of cleaving BARC solubility and etch rate. Additionally, the critical temperatures at which etch-resistant monomers are cleaved to increase etch rate need not be evenly incremented as illustrated in FIG. 9, but rather can occur at any suitable temperature position on the scale. For example, critical temperatures (and corresponding etch rates) can exhibit a pseudo-Gaussian distribution if desired, depending on the particular cleaving monomers employed.

Turning now to FIGS. 10-12, in accordance with one or more aspects of the present invention, a wafer 1002 (or one or more die located thereon) situated on a stage 1004 can be logically partitioned into grid blocks to facilitate concurrent measurements of solubility, temperature, etc., as the wafer matriculates through a semiconductor fabrication process. This can facilitate selectively determining to what extent, if any, bake temperature and/or fabrication adjustments are necessary. Obtaining such information can also assist in determining problem areas associated with fabrication processes.

FIG. 10 illustrates a perspective view of the steppable stage 1004 supporting the wafer 1002. The wafer 1002 can be divided into a grid pattern as shown in FIG. 10. Each grid block (XY) of the grid pattern corresponds to a particular portion of the wafer 1002 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess wafer-to-wafer and lot-to-lot variations. For example, a portion P (not shown) of a first wafer (not shown) can be compared to the corresponding portion P (not shown) of a second wafer. Thus, deviations between wafers and lots can be determined in order to calculate adjustments to the fabrication components that are necessary to accommodate for the wafer-to-wafer and/or lot-to-lot variations.

In FIG. 11, one or more respective portions of the wafer 1002 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the wafer 1002 and or one or more die located thereon can be mapped into any suitable number and/or arrangement of grid blocks to effectuate desired monitoring and control.

FIG. 12 is a representative table of concurrently measured critical dimensions and overlay taken at various portions of the wafer 1002 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_u$) (e.g., overlay and critical dimensions are not within acceptable tolerances, thus at least an overlay or CD error exists). Thus, it has been determined that an undesirable fabrication condition exists at the portion of the wafer 1002 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire wafer. It is to be appreciated that fabrication process parameters can be adapted so as to maintain, increase, decrease and/or qualitatively change the fabrication of the respective portions of the wafer 1002 as desired. For example, when the fabrication process has reached a pre-determined threshold level (e.g., X % of grid blocks have acceptable CDs and no overlay error exists), a fabrication step can be terminated.

Figure 13:
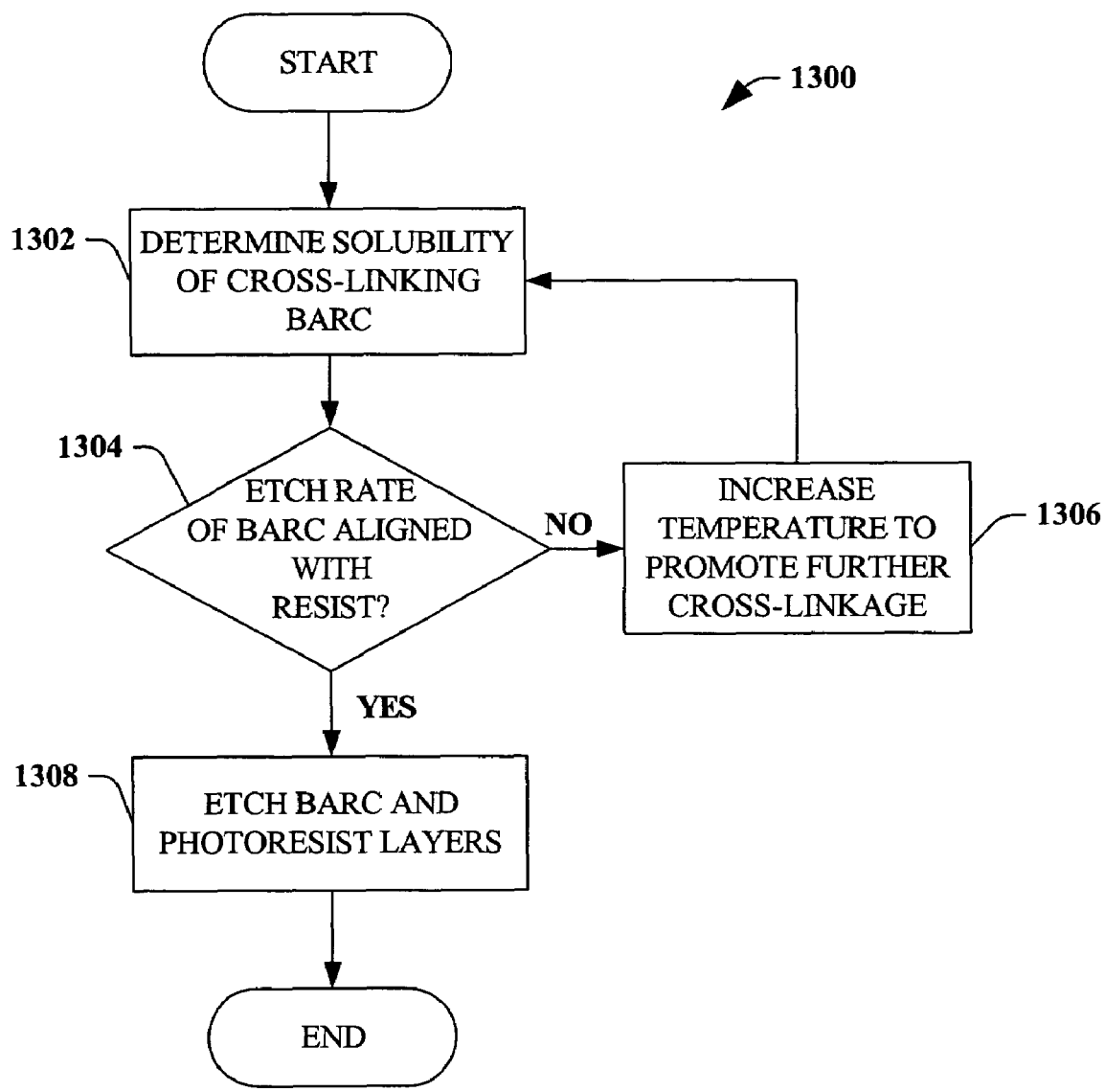
FIG. 13 is an illustration of a methodology for adjusting BARC etch rate in accordance with an aspect of the present invention.
Figure 14:
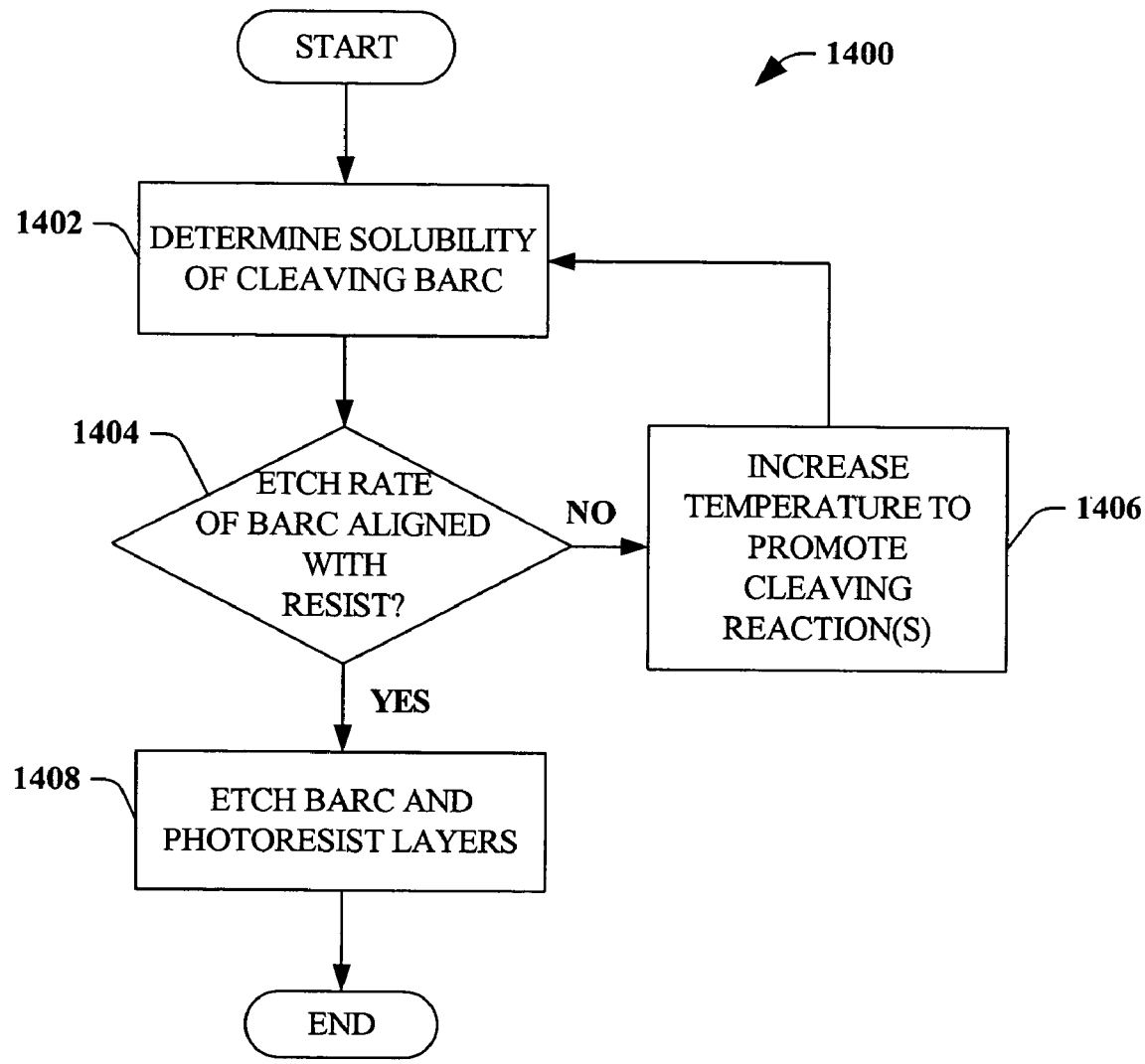
FIG. 14 illustrates a methodology 1400 for adjusting BARC etch rate in accordance with an aspect of the present invention.
Figure 15:
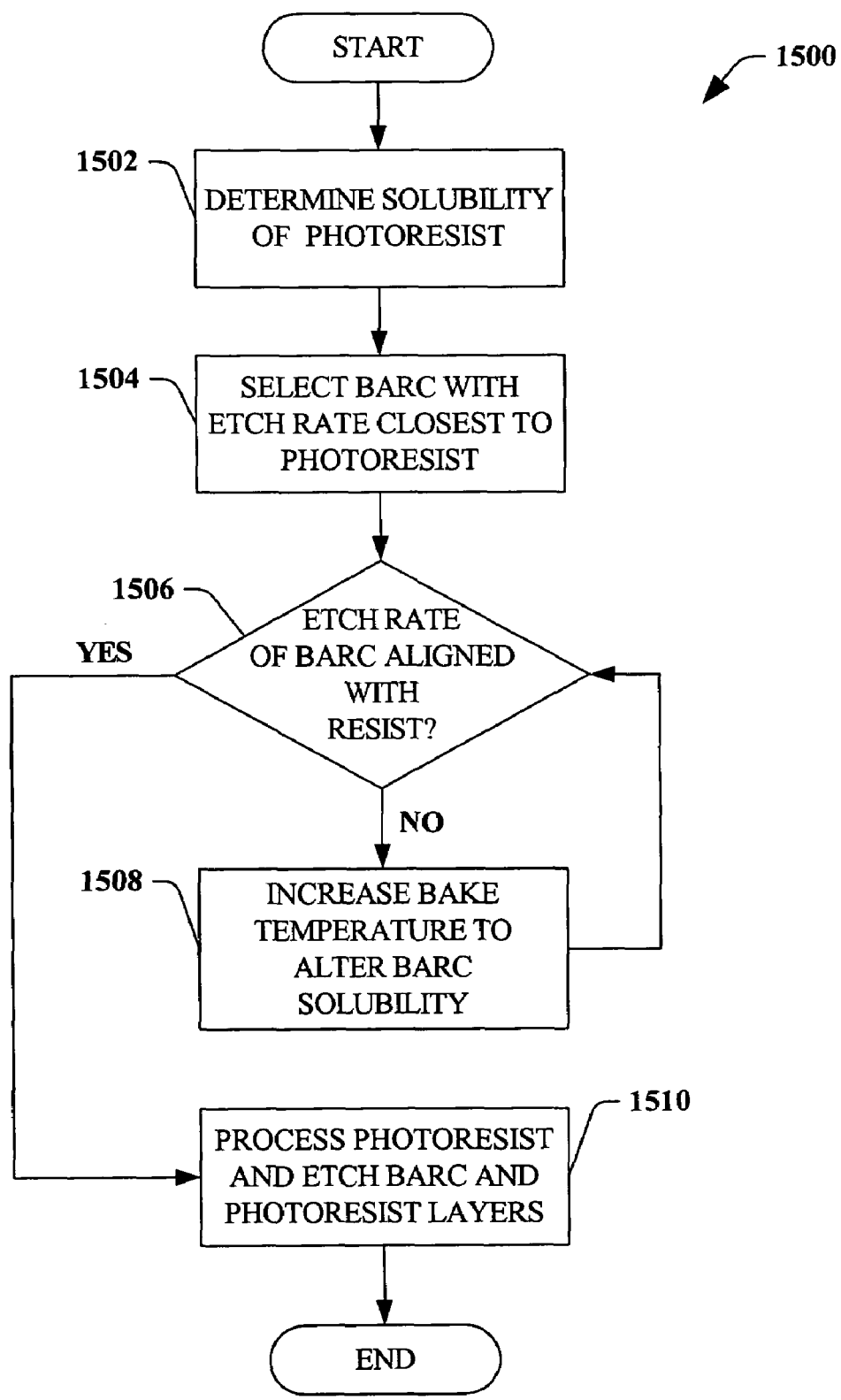
FIG. 15 illustrates a methodology 1500 for selectively adjusting an etch rate of an organic BARC, in accordance with an aspect of the present invention.

Turning briefly to FIGS. 13, 14, and 15, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 13 is an illustration of a methodology 1300 for adjusting BARC etch rate in accordance with an aspect of the present invention. At 1302, a determination is made regarding the solubility of a cross-linking BARC. The solubility of a particular cross-linking BARC can be predetermined or can be determined in-situ, via, for example, a metrology system, such as a scatterometry system. Once the solubility of the BARC has been determined, a comparison of the etch rate associated with such solubility and an etch rate of a photoresist that is deposited over the BARC can be made. At 1304, a determination is made regarding whether the etch rate of the BARC is in alignment with the etch rate of the photoresist. The etch rate of the photo resist can be known, can be inferred from known solubility information related to the photoresist, and/or can be inferred from solubility information related to the photoresist that is obtained via, for example, a scatterometry system, etc. If solubility information related to the BARC indicates that it is more soluble than the photoresist, then undercutting defects can potentially occur during etching. In order to mitigate such occurrences, bake temperature can be increased to a predetermined critical temperature in order to facilitate cross-linkage between molecules in the BARC layer at 1306. Such cross-linkage creates greater structural strength in the BARC layer to reduce solubility and, therefore reduce etch rate. The methodology 1300 can then revert to 1302 for another iteration of solubility measurement after temperature adjustment at 1306.

If it is determined at 1304 that the solubility of the cross-linking BARC is sufficient to permit etching of the BARC at the same rate as a photoresist deposited there over, then the method can proceed to 1308, where the photoresist and organic BARC layers can be concurrently etched.

FIG. 14 illustrates a methodology 1400 for adjusting BARC etch rate in accordance with an aspect of the present invention. At 1402, a determination can be made regarding the solubility of a cleaving organic BARC. The solubility of a particular cleaving BARC can be predetermined or can be determined in-situ, via, for example, a metrology system, such as a scatterometry system. Once the solubility of the BARC has been determined, a comparison of the etch rate associated with such solubility and an etch rate of a photoresist that is deposited over the BARC can be made. At 1404, a determination is made regarding whether the etch rate of the BARC is in alignment with the etch rate of the photoresist. The etch rate of the photoresist can be known, can be inferred from known solubility information related to the photoresist, and/or can be inferred from solubility information related to the photoresist that is obtained via, for example, a scatterometry system, etc. If solubility information related to the BARC indicates that it is less soluble than the photoresist, then line edge roughness defects can potentially occur during etching. In order to mitigate such occurrences, bake temperature can be increased to a predetermined critical temperature in order to facilitate cleaving reactions that effectively remove etch-resistant groups from polymer chains in the cleaving BARC layer at 1406.

For example, a cleaving BARC can comprise cleaving monomers as components of one or more polymer chains that can be cleaved from the polymer chains at specific temperatures. For instance, a cleaving BARC can have a solubility S at a standard bake temperature T. Cleaving monomer A can be selectively removed from a polymer chains via baking the cleaving BARC at a temperature $T+C_1$, in order to increase the solubility of the organic cleaving BARC. A second cleaving monomer B can be removed form a polymer chain at a bake temperature of $T+C_2$, where $C_2$ is greater than $C_1$, in order to further increase solubility of the cleaving BARC. Such cleaving reactions compromise the structural integrity of the BARC layer to reduce solubility and, therefore reduce etch rate. Once the cleaving BARC has been baked at an increased temperature to induce at least one cleaving reaction, the method can revert to 1402 for another iteration of BARC solubility measurement.

If it is determined at 1404 that the solubility of the cleaving BARC is sufficient to permit etching of the BARC at the same rate as a photoresist to be deposited there over, then the photoresist layer can be processed on top of the BARC and the method can proceed to 1408, where the photoresist and organic BARC layers can be concurrently etched.

FIG. 15 illustrates a methodology 1500 for selectively adjusting an etch rate of an organic BARC, in accordance with an aspect of the present invention. At 1052, the solubility of a photoresist to be employed during wafer manufacture can be determined. Such determination can be based on known properties of the photoresist and/or on information gleaned via a monitoring system such as, for example, a scatterometry system. Based at least in part on solubility information associated with the photoresist, an etch rate thereof can be deduced. Additionally, the etch rate of the photoresist can be predetermined. At 1504, an organic BARC (e.g., either cross-linking or cleaving) can be selected for employment in wafer manufacture based at least in part on known photoresist information. Then, at 1506, a determination can be made regarding whether the etch rate of the BARC is aligned with that of the photoresist. If the etch rate of the selected BARC is not aligned with the etch rate of the photoresist, then at 1508, bake temperature can be increased during a bake of the BARC to adjust solubility thereof. For instance, if a cross-linking BARC is selected, then increasing bake temperature can promote increased cross-linkage between molecules in the BARC layer, which in turn can decrease solubility to align etch rate of the BARC with that of the photoresist. Additionally, if a cleaving BARC is selected, then etch rate thereof can be increased by increasing bake temperature to promote cleaving reactions that increase solubility of the BARC. In this manner, a suitable BARC can be selected and an etch rate thereof can be adjusted to align with the etch rate of a photoresist that is deposited over the BARC. Once the solubility of the selected BARC has been adjusted via bake temperature manipulation at 1508, the method can revert to 1506 for reassessment of whether the etch rate of the ABRC matches the etch rate of the photoresist.

If it is determined that the etch rate of the selected BARC is aligned with the etch rate of the photoresist at 1506, then after baking the BARC, the photoresist can be deposited onto the wafer (e.g., via a spin-on technique, or any other suitable technique), and processed in accordance with standard wafer manufacture protocol, at 1510, and the photoresist and organic BARC can be etched concurrently.

Figure 16:
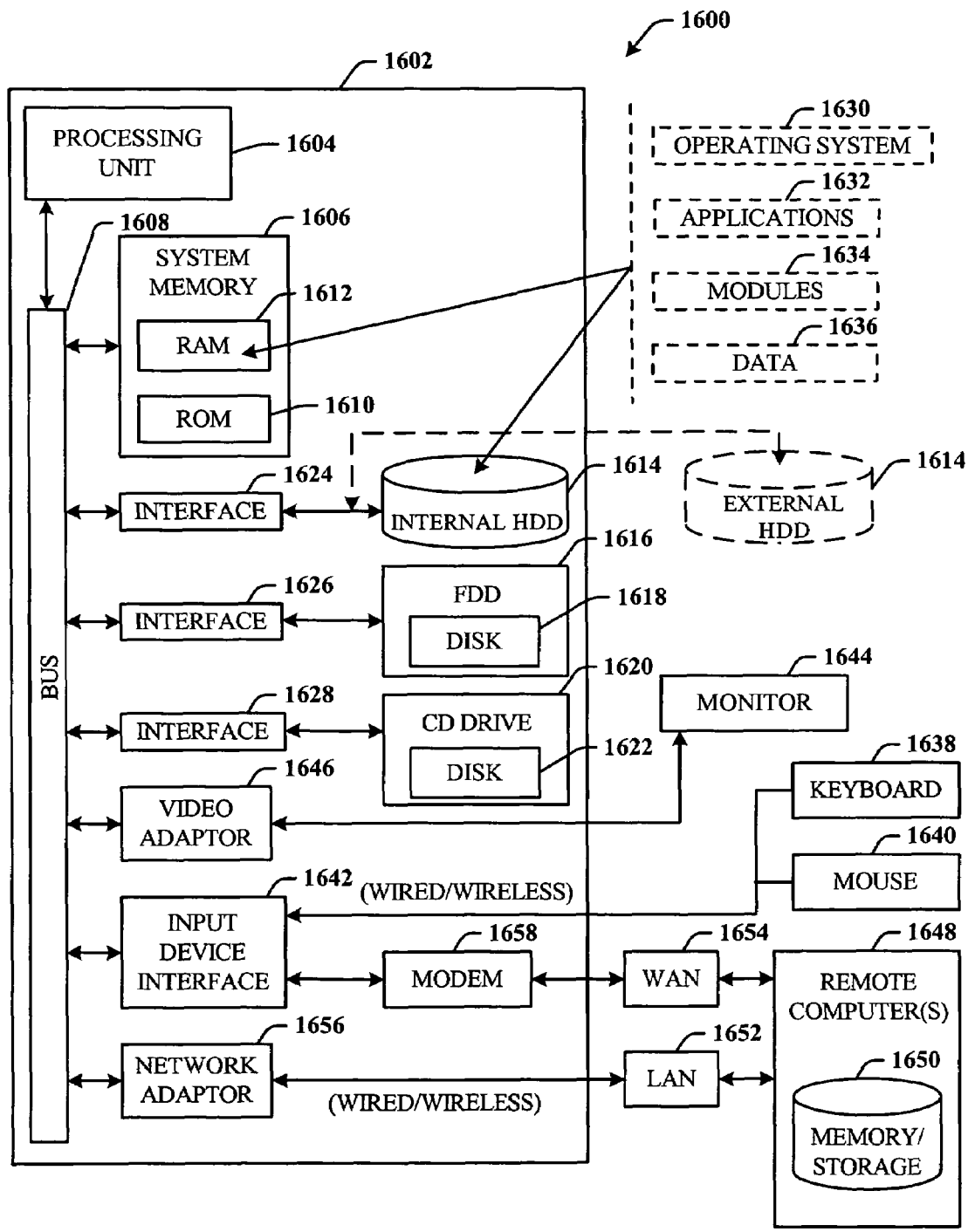
FIGS. 16 and 17 are illustrations of exemplary computing systems and/or environments in connection with facilitating employment of the subject invention.
Figure 17:
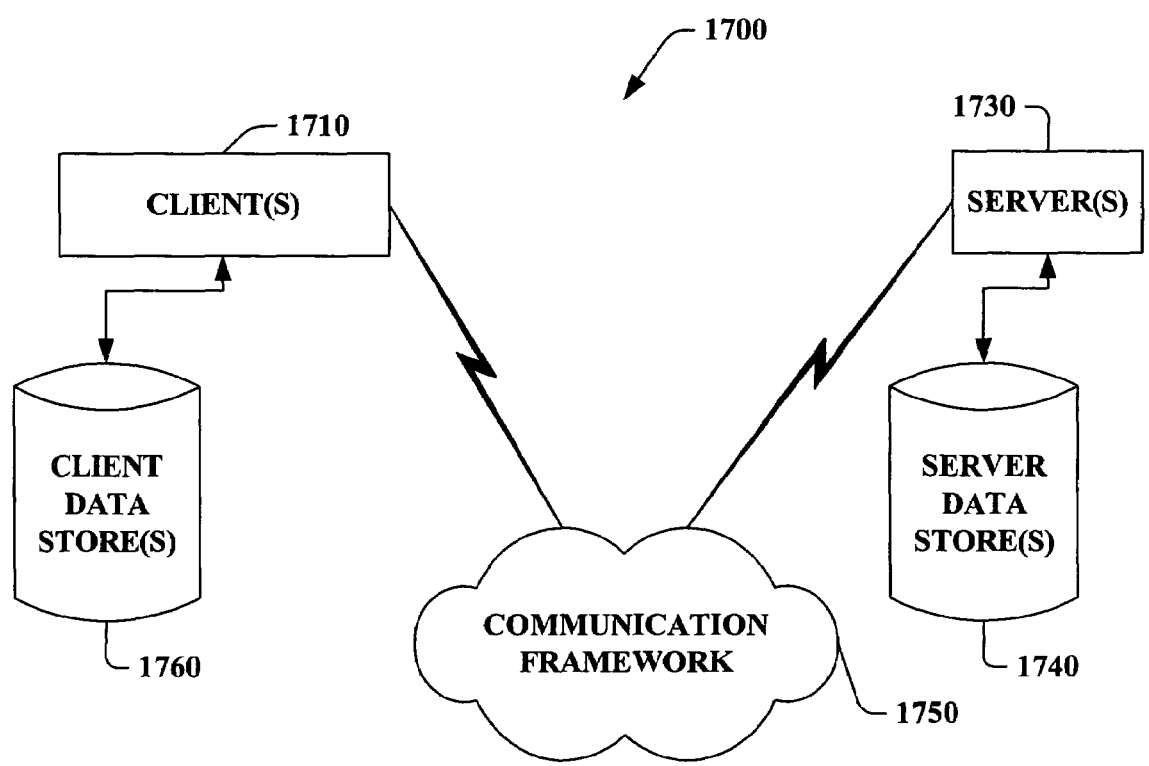

In order to provide a context for the various aspects of the invention, FIGS. 16 and 17 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

Referring now to FIG. 16, there is illustrated a block diagram of a computer operable to execute the disclosed architecture. In order to provide additional context for various aspects of the present invention, FIG. 16 and the following discussion are intended to provide a brief, general description of a suitable computing environment 1600 in which the various aspects of the present invention can be implemented. While the invention has been described above in the general context of computer-executable instructions that can run on one or more computers, those skilled in the art will recognize that the invention also can be implemented in combination with other program modules and/or as a combination of hardware and software. Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, mini-computers, mainframe computers, as well as personal computers, hand-held computing devices, microprocessor-based or programmable consumer electronics, and the like, each of which can be operatively coupled to one or more associated devices. The illustrated aspects of the invention can also be practiced in distributed computing environments where certain tasks are performed by remote processing devices that are linked through a communications network. In a distributed computing environment, program modules can be located in both local and remote memory storage devices.

With reference again to FIG. 16, there is illustrated an exemplary environment 1600 for implementing various aspects of the invention includes a computer 1602, the computer 1602 including a processing unit 1604, a system memory 1606 and a system bus 1608. The system bus 1608 couples system components including, but not limited to, the system memory 1606 to the processing unit 1604. The processing unit 1604 can be any of various commercially available processors. Dual microprocessors and other multi-processor architectures can also be employed as the processing unit 1604.

The system bus 1608 can be any of several types of bus structure that can further interconnect to a memory bus (with or without a memory controller), a peripheral bus, and a local bus using any of a variety of commercially available bus architectures. The system memory 1606 includes read only memory (ROM) 1610 and random access memory (RAM) 1612. A basic input/output system (BIOS) is stored in a non-volatile memory 1610 such as ROM, EPROM, EEPROM, which BIOS contains the basic routines that help to transfer information between elements within the computer 1602, such as during start-up.

The computer 1602 further includes a hard disk drive 1614, a magnetic disk drive 1616, (e.g., to read from or write to a removable disk 1618) and an optical disk drive 1620, (e.g., reading a CD-ROM disk 1622 or to read from or write to other high capacity optical media such as Digital Video Disk (DVD)). The hard disk drive 1614, magnetic disk drive 1616 and optical disk drive 1620 can be connected to the system bus 1608 by a hard disk drive interface 1624, a magnetic disk drive interface 1626 and an optical drive interface 1628, respectively. The drives and their associated computer-readable media provide nonvolatile storage of data, data structures, computer-executable instructions, and so forth. For the computer 1602, the drives and media accommodate the storage of broadcast programming in a suitable digital format. Although the description of computer-readable media above refers to a hard disk, a removable magnetic disk and a CD, it should be appreciated by those skilled in the art that other types of media which are readable by a computer, such as zip drives, magnetic cassettes, flash memory cards, digital video disks, cartridges, and the like, can also be used in the exemplary operating environment, and further that any such media can contain computer-executable instructions for performing the methods of the present invention.

A number of program modules can be stored in the drives and RAM 1612, including an operating system 1630, one or more application programs 1632, other program modules 1634 and program data 1636. It is appreciated that the present invention can be implemented with various commercially available operating systems or combinations of operating systems.

A user can enter commands and information into the computer 1602 through a keyboard 1638 and a pointing device, such as a mouse 1640. Other input devices (not shown) can include a microphone, an IR remote control, a joystick, a game pad, a satellite dish, a scanner, or the like. These and other input devices are often connected to the processing unit 1604 through a serial port interface 1642 that is coupled to the system bus 1608, but can be connected by other interfaces, such as a parallel port, a game port, a universal serial bus ("USB"), an IR interface, etc. A monitor 1644 or other type of display device is also connected to the system bus 1608 via an interface, such as a video adapter 1646. In addition to the monitor 1644, a computer typically includes other peripheral output devices (not shown), such as speakers, printers etc.

The computer 1602 can operate in a networked environment using logical connections via wired and/or wireless communications to one or more remote computers, such as a remote computer(s) 1648. The remote computer(s) 1648 can be a workstation, a server computer, a router, a personal computer, portable computer, microprocessor-based entertainment appliance, a peer device or other common network node, and typically includes many or all of the elements described relative to the computer 1602, although, for purposes of brevity, only a memory storage device 1650 is illustrated. The logical connections depicted include a local area network (LAN) 1652 and a wide area network (WAN) 1654. Such networking environments are commonplace in offices, enterprise-wide computer networks, intranets and the Internet.

When used in a LAN networking environment, the computer 1602 is connected to the local network 1652 through a wired or wireless communication network interface or adapter 1656. The adaptor 1656 can facilitate wired or wireless communication to the LAN 1652, which can also include a wireless access point disposed thereon for communicating with the wireless adaptor 1656. When used in a WAN networking environment, the computer 1602 typically includes a modem 1658, or is connected to a communications server on the LAN, or has other means for establishing communications over the WAN 1654, such as the Internet. The modem 1658, which can be internal or external and a wired or wireless device, is connected to the system bus 1608 via the serial port interface 1642. In a networked environment, program modules depicted relative to the computer 1602, or portions thereof, can be stored in the remote memory storage device 1650. It will be appreciated that the network connections shown are exemplary and other means of establishing a communications link between the computers can be used.

The computer 1602 is operable to communicate with any wireless devices or entities operably disposed in wireless communication, e.g., a printer, scanner, desktop and/or portable computer, portable data assistant, any piece of equipment or location associated with a wirelessly detectable tag (e.g., a kiosk, news stand, restroom), and telephone. This includes at least Wi-Fi and Bluetooth™ wireless technologies. Thus the communication can be a predefined structure as with conventional network or simply an ad hoc communication between at least two devices.

Wi-Fi, or Wireless Fidelity, allows connection to the Internet from a couch at home, a bed in a hotel room or a conference room at work, without wires. Wi-Fi is a wireless technology like a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, with an 11 Mbps (802.11b) or 54 Mbps (802.11a) data rate or with products that contain both bands (dual band), so the networks can provide real-world performance similar to the basic 10BaseT wired Ethernet networks used in many offices.

The disclosed computer 1602 can also be employed with HiperLAN technology. HiperLAN is a set of wireless local area network (WLAN) communication standards primarily used in European countries. There are two specifications: HiperLAN/1 and HiperLAN/2, both of which have been adopted by the European Telecommunications Standards Institute. The HiperLAN standards provide features and capabilities similar to those of the IEEE 802.11 WLAN standards used in the U.S. and other adopting countries. HiperLAN/1 provides communications at up to 20 Mbps in the 5-GHz range of the radio frequency spectrum. HiperLAN/2 operates at up to 54 Mbps in the same RF band, and is compatible with 3G (third-generation) WLAN systems for sending and receiving data, images, and voice communications. HiperLAN/2 has the potential, and is intended, for implementation worldwide in conjunction with similar systems in the 5-GHz RF band.

FIG. 17 is a schematic block diagram of a sample-computing environment 1700 with which the present invention can interact. The system 1700 includes one or more client(s) 1710. The client(s) 1710 can be hardware and/or software (e.g., threads, processes, computing devices). The system 1700 also includes one or more server(s) 1730. The server(s) 1730 can also be hardware and/or software (e.g., threads, processes, computing devices). The servers 1730 can house threads to perform transformations by employing the present invention, for example. One possible communication between a client 1710 and a server 1730 can be in the form of a data packet adapted to be transmitted between two or more computer processes. The system 1700 includes a communication framework 1750 that can be employed to facilitate communications between the client(s) 1710 and the server(s) 1730. The client(s) 1710 are operably connected to one or more client data store(s) 1760 that can be employed to store information local to the client(s) 1710. Similarly, the server(s) 1730 are operably connected to one or more server data store(s) 1740 that can be employed to store information local to the servers 1730.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for adjusting an etch rate of an organic bottom antireflective coating layer on a wafer, comprising:
    exposing the organic bottom antireflective coating layer to varied bake temperatures to determine a solubility of the organic bottom antireflective coating layer after baking at each of the varied bake temperatures;
    deducing an etch rate for the organic bottom antireflective coating layer based at least in part on information related to the solubility of the organic bottom antireflective coating layer after baking at each of the varied bake temperatures;
    determining an etch rate for a photoresist to be deposited over the organic bottom antireflective coating layer; and
    adjusting a temperature at which the organic bottom antireflective coating layer is baked during manufacture to align the etch rate of the organic bottom antireflective coating layer with the etch rate of the photoresist.

2. The method of claim 1, further comprising employing a scatterometry system to determine solubility of at least one region of the organic bottom antireflective coating layer after exposure of the at least one region to at least one intensity of energy from an energy source.

3. The method of claim 1, the etch rate of the photoresist to be deposited over the organic bottom antireflective coating layer is predetermined.

4. The method of claim 1, an reference etch rate of the organic bottom antireflective coating layer is determined via baking the organic bottom antireflective coating layer at a reference bake temperature.

5. The method of claim 1, further comprising baking the organic bottom antireflective coating layer at the adjusted temperature.

6. The method of claim 5, further comprising depositing the photoresist over the organic bottom antireflective coating layer after baking.

7. The method of claim 6, further comprising concurrently etching the photoresist and organic bottom antireflective coating layers at a uniform etch rate.

8. The method of claim 1, the organic bottom antireflective coating layer is at least one of a cross-linking organic bottom antireflective coating layer and a cleaving organic bottom antireflective coating layer.

9. The method of claim 8, further comprising increasing a bake temperature of the cross-linking organic bottom antireflective coating layer to increase cross-linkage in the organic bottom antireflective coating layer and to decrease solubility of the cross-linking organic bottom antireflective coating layer.

10. The method of claim 9, further comprising aligning an etch rate of the cross-linking organic bottom antireflective coating layer to the etch rate of the photoresist.

11. The method of claim 8, further comprising increasing a bake temperature of the cleaving organic bottom antireflective coating layer to increase the solubility of the cleaving organic bottom antireflective coating layer.

12. The method of claim 11, further comprising aligning an etch rate of the cleaving organic bottom antireflective coating layer to the etch rate of the photoresist.

13. The method of claim 11, the cleaving organic bottom antireflective coating layer comprises at least one polymer chain that has at least one etch-resistant cleaving monomer that is removed from the polymer chain at the increased bake temperature to increase solubility of the cleaving organic bottom antireflective coating layer.

* * * * *